(12) United States Patent
Nakamura et al.

(10) Patent No.: US 9,758,929 B2
(45) Date of Patent: Sep. 12, 2017

(54) SHEET MANUFACTURING APPARATUS AND SHEET MANUFACTURING METHOD

(71) Applicant: SEIKO EPSON CORPORATION, Tokyo (JP)

(72) Inventors: Masahide Nakamura, Nagano (JP); Toshiaki Yamagami, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/023,008

(22) PCT Filed: Jun. 24, 2014

(86) PCT No.: PCT/JP2014/003388
§ 371 (c)(1),
(2) Date: Mar. 18, 2016

(87) PCT Pub. No.: WO2015/049817
PCT Pub. Date: Apr. 9, 2015

(65) Prior Publication Data
US 2016/0230338 A1    Aug. 11, 2016

(30) Foreign Application Priority Data

Oct. 1, 2013    (JP) .................................. 2013-206155

(51) Int. Cl.
| | |
|---|---|
| *B07B 1/22* | (2006.01) |
| *B07B 1/18* | (2006.01) |
| *D21H 27/00* | (2006.01) |
| *D04H 1/732* | (2012.01) |
| *D21B 1/08* | (2006.01) |
| *B27N 3/04* | (2006.01) |
| *B07B 13/00* | (2006.01) |

(Continued)

(52) U.S. Cl.
CPC ............. *D21H 5/2607* (2013.01); *B07B 1/18* (2013.01); *B07B 1/22* (2013.01); *B07B 9/00* (2013.01); *B07B 13/00* (2013.01); *B07B 13/16* (2013.01); *B29C 41/26* (2013.01); *B29D 7/01* (2013.01); *D21B 1/08* (2013.01); *D21H 17/53* (2013.01); *B27N 3/14* (2013.01)

(58) Field of Classification Search
None
See application file for complete search history.

(56) References Cited

U.S. PATENT DOCUMENTS

| | | | |
|---|---|---|---|
| 8,882,965 B2 | 11/2014 | Yamagami et al. | |
| 9,174,243 B2 * | 11/2015 | Nakamura | ............. D21D 99/00 |
| 9,194,081 B2 | 11/2015 | Yamagami | |

FOREIGN PATENT DOCUMENTS

| | | |
|---|---|---|
| CN | 102605664 A | 7/2012 |
| JP | 11-147209 A | 6/1999 |
| | (Continued) | |

*Primary Examiner* — Mary F Theisen
(74) *Attorney, Agent, or Firm* — Global IP Counselors, LLP (57) ABSTRACT

A sheet manufacturing apparatus includes a screening unit having first openings for screening a defibrated material that is defibrating-processed; a refining unit that has second openings having sizes equal to or greater than sizes of the first openings and refines the defibrated material passing through the screening unit by causing the defibrated material to pass through the second openings; and a deposition unit on which the defibrated material passing through the refining unit is deposited.

14 Claims, 4 Drawing Sheets (51) Int. Cl.
*B07B 9/00* (2006.01)
*B07B 13/16* (2006.01)
*B29C 41/26* (2006.01)
*B29D 7/01* (2006.01)
*D21H 17/53* (2006.01)
*B27N 3/14* (2006.01)

(56) References Cited

FOREIGN PATENT DOCUMENTS

| | | |
|---|---|---|
| JP | 2012-144819 A | 8/2012 |
| JP | 2013-147772 A | 8/2013 |

\* cited by examiner

SHEET MANUFACTURING APPARATUS AND SHEET MANUFACTURING METHOD

TECHNICAL FIELD

The present invention relates to a sheet manufacturing apparatus and a sheet manufacturing method.

BACKGROUND ART

In the related art, as a sheet manufacturing apparatus, a so-called wet-type apparatus, in which a raw material containing fiber is poured in water, is disaggregated mainly by mechanical action, and is repulped, has been employed. In such a wet-type sheet manufacturing apparatus, a large amount of water is required and the apparatus is increased in size. Furthermore, times and efforts are taken to provide maintenance of water treatment facilities and energy for a drying process is largely consumed.

Accordingly, in order to reduce the size and save energy, a dry-type sheet manufacturing apparatus in which as little water as possible is used has been proposed (for example, see PTL 1).

A technique is described in PTL 1 in which pieces of paper are defibrated into fibers by a dry-type defibrating machine, deinking of the fibers is performed in a cyclone, deinked fibers pass through a screen having small holes on a surface of a forming drum and are deposited on a mesh belt, and then paper is formed.

CITATION LIST

Patent Literature

PTL 1: Japanese Unexamined Patent Application Publication No. 2012-144819

SUMMARY OF INVENTION

Technical Problem

However, in a paper manufacturing apparatus disclosed in PTL 1, some of the fibers are adhered to the screen having the small holes on the surface of the forming drum and then cause clogging. The fibers cannot pass through the small hole with clogging and the fibers pass through the small hole without clogging. Thus, a defibrated material is unlikely to be uniformly dispersed on the mesh belt. When forming the paper in this state, paper having no uniform density and thickness is manufactured. Thus, strength of the paper becomes insufficient or a paper with desired texture cannot be obtained.

Solution to Problem

The invention can be realized in the following aspects or application examples.

According to an aspect of the invention, there is provided a sheet manufacturing apparatus including: a screening unit that has first openings for screening a defibrated material that is defibrating-processed; a refining unit that has second openings having sizes equal to or greater than sizes of the first openings and refines the defibrated material passing through the screening unit by causing the defibrated material to pass through the second openings; and a deposition unit on which the defibrated material passing through the refining unit is deposited.

In such a sheet manufacturing apparatus, the defibrated material passes through the first openings of the screening unit. In this case, the defibrated material passing through the screening unit may be in a state of being not uniformly deposited, for example, by reason of clogging in a part of the first openings. Then, the defibrated material passing through the screening unit further passes through the second openings. Since the sizes of the second openings are equal to or greater than the sizes of the first openings, the defibrated material passes through the second openings without clogging. Thus, the defibrated material can be uniformly deposited. In addition, when the defibrated material passing through the screening unit is further delivered to the refining unit, the defibrated material may be aggregated into a lump shape, but the lump-shaped defibrated material can be refined by passing through the second openings. As a result, the refining unit can deposit the defibrated material having good uniformity on the deposition unit and such a sheet manufacturing apparatus can manufacture a sheet having strength and good texture.

In the sheet manufacturing apparatus according to the invention, the sizes of the second openings may be greater than the sizes of the first openings.

In such a sheet manufacturing apparatus, it is possible to reduce a possibility that the defibrated material passing through the first openings of the screening unit remains within the refining unit. Thus, in such a sheet manufacturing apparatus, it is possible to prevent the refining unit from being clogged by the defibrated material (for example, entangled defibrated material) that does not pass through the second openings.

In the sheet manufacturing apparatus according to the invention, the refining unit may be provided with a plurality of the second openings and the sizes of the plurality of second openings may be equal to each other.

In such a sheet manufacturing apparatus, since the sizes of the plurality of second openings are equal to each other, it is possible to uniformly deposit the defibrated material on the deposition unit by causing the defibrated material to pass through the second openings.

In the sheet manufacturing apparatus according to the invention, the screening unit may be provided with a plurality of the first openings and the sizes of the plurality of first openings may be equal to each other.

In such a sheet manufacturing apparatus, since the sizes of the plurality of first openings are equal to each other, it is possible to cause the size of the defibrated material passing through the first openings of the screening unit to fall in a predetermined range.

In the sheet manufacturing apparatus according to the invention, the screening unit may be movable, the refining unit may be movable, and the screening unit may move faster than the refining unit.

In such a sheet manufacturing apparatus, the screening unit is likely to be clogged more than the refining unit. Thus, fibers having sizes enough to pass through the first openings may not pass through the screening unit by being caught in a clogged portion. However, a centrifugal force is increased with a moving speed of the screening unit made faster than that of the refining unit and the fibers can pass through the first openings. Furthermore, it is possible to suppress that an amount of the defibrated material passing through the first openings per unit time is decreased due to the clogging.

In the sheet manufacturing apparatus according to the invention, the screening unit may be movable and the screening unit may move faster than the refining unit.

In such a sheet manufacturing apparatus, the screening unit is likely to be clogged more than the refining unit. Thus, fibers having sizes enough to pass through the first openings may not pass through the screening unit by being caught in a clogged portion. However, the centrifugal force is increased with the moving speed of the screening unit made faster than that of the refining unit and the fibers can pass through the first openings. Furthermore, the refining unit can cause the fibers to pass therethrough by using airflow from insides of the second openings and the like even if the refining unit is not moved.

The sheet manufacturing apparatus according to the invention may further include a supplying unit that supplies resin bonding the defibrated material between the screening unit and the refining unit.

If resin is supplied to a transport unit connected to the screening unit on an upstream side in a transport direction of the defibrated material, the resin may adhere to a non-screened material (residue that does not pass through the first openings) that is not screened in the screening unit. Then, the resin adhering to the non-screened material is no longer used in the manufacturing of the sheet thereafter and an amount of the resin is wasted. Furthermore, even if the resin is supplied to the defibrated material after passing through the refining unit, the fibers and the resin are not uniformly mixed. It is possible to mix the fibers and the resin in the middle of transporting to the refining unit or in the refining unit and the resin is not wasted by supplying the resin between the screening unit and the refining unit.

The sheet manufacturing apparatus according to the invention may further include a defibrating unit that performs a defibrating process on a defibration object and a returning flow path that returns the defibrated material not passing through the screening unit to the defibrating unit.

In such a sheet manufacturing apparatus, it is possible to perform the defibrating process on the residue (for example, the residue including undefibrated pieces and the defibrated material having a size greater than those of the openings of the screening unit) that does not pass through the screening unit in the defibrating unit. That is, the undefibrated pieces can be used in the manufacturing of the sheet without being discarded.

The sheet manufacturing apparatus according to the invention may further include a screening unit that screens a defibrated material that is defibrating-processed by causing the defibrated material to pass through first openings, a refining unit that refines the defibrated material passing through the screening unit, and an depositing unit on which the defibrated material passing through the refining unit is deposited.

In such a sheet manufacturing apparatus, the defibrated material passes through the first openings of the screening unit. In this case, the defibrated material passing through the screening unit is in a state of being not uniformly deposited, for example, by reason of clogging in a part of the first openings and the like. Then, the defibrated material can be in a state of being further uniformed by providing the refining unit that refines the defibrated material passing through the screening unit. As a result, it is possible to manufacture the sheet having the strength and good texture.

According to another aspect of the invention, there is provided a sheet manufacturing method including: a step of screening a defibrated material that is defibrating-processed by first openings; a step of causing the defibrated material passing through the first openings to pass through second openings having sizes equal to or greater than sizes of the first openings; and a step of depositing the defibrated material passing through the second openings.

In such a sheet manufacturing method, it is possible to manufacture the sheet having good texture.

In the sheet manufacturing method, a plurality of the first openings and the second openings may be respectively provided, the sizes of the plurality of first openings may be equal to each other, and the sizes of the plurality of second openings may be equal to each other.

In the sheet manufacturing method, a screening unit having the first openings and a refining unit having the second openings may be movable, and the screening unit may move faster than the refining unit.

The sheet manufacturing method may further include a step of supplying resin that bonds the defibrated material between the step of screening the defibrated material that is defibrating-processed by the first openings and the step of causing the defibrated material passing through the first openings to pass through the second openings.

The sheet manufacturing method may further include a step of returning the defibrated material not passing through the first openings to a defibrating unit in which a defibration object is defibrating-processed.

DESCRIPTION OF EMBODIMENTS

Hereinafter, a preferred embodiment of the invention will be described in detail with reference to the drawings. Moreover, the embodiment described below does not unduly limit contents of the invention described in the claims. In addition, not all of the elements that are described are essential requirements of the invention.

1. Sheet Manufacturing Apparatus

Figure 1:
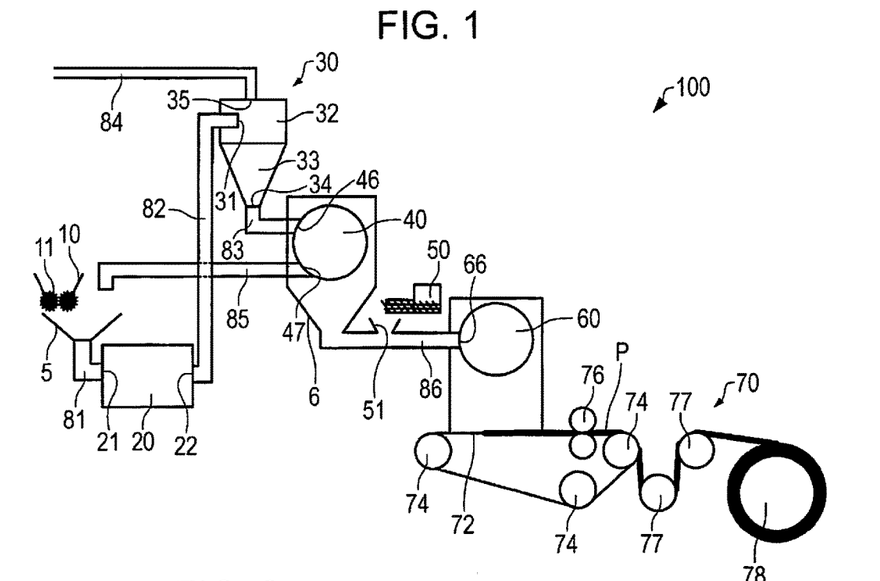
FIG. 1 is a view schematically illustrating a sheet manufacturing apparatus according to an embodiment.

A sheet manufacturing apparatus according to the embodiment will be described with reference to the drawings. FIG. 1 is a view schematically illustrating a sheet manufacturing apparatus 100 according to the embodiment. Moreover, for the sake of convenience, in FIG. 1, a screening unit 40 and a refining unit 60 are simplified.

As illustrated in FIG. 1, the sheet manufacturing apparatus 100 includes a crushing unit 10, a defibrating unit 20, a classifying unit 30, the screening unit 40, a resin supplying unit 50, the refining unit 60, and a sheet forming unit 70.

The crushing unit 10 cuts a raw material such as a pulp sheet or a sheet (for example, waste paper of A4 size) to be small pieces in the air. Shapes and sizes of the small pieces are not particularly limited, but, for example, are several cm squares. In the illustrated example, the crushing unit 10 has crushing blades 11 and it is possible to cut the fed raw material by the crushing blades 11. The crushing unit 10 may have an automatic feeding unit (not illustrated) for continuously feeding the raw material.

The small pieces that are cut by the crushing unit 10 are transported to the defibrating unit 20 via a first transport unit 81 after being received by a hopper 5. The first transport unit 81 communicates with an inlet 21 of the defibrating unit 20. Shapes of the first transport unit 81 and second to sixth transport units 82 to 86 described below are, for example, a tubular.

Figure 2:
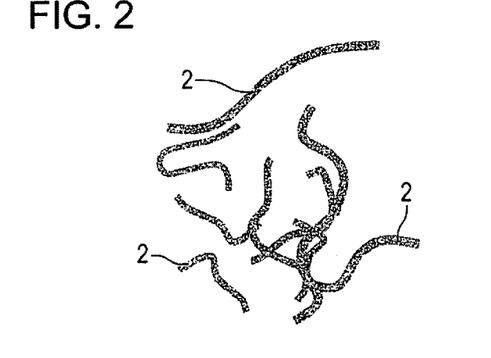
FIG. 2 is a view schematically illustrating a defibrated material.
Figure 3:
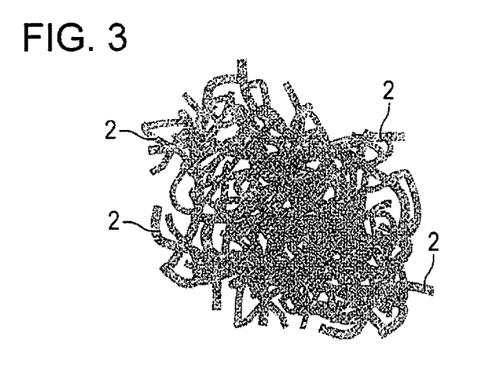
FIG. 3 is a view schematically illustrating the defibrated material.

The defibrating unit 20 performs a defibrating process on the small pieces (defibration object). The defibrating unit 20 generates fibers 2 that are untangled in fibrous by performing the defibrating process on the small pieces. Here, FIGS. 2 and 3 are views schematically illustrating the fibers 2 that are untangled.

Here, the "defibrating process" refers that the small pieces formed by binding a plurality of fibers are untangled to the fibers one by one. The "defibrated material" is referred to as one passing through the defibrating unit 20. The "defibrated material" may include resin (resin for bonding a plurality of fibers to each other) particles, ink particles such as ink, toner, and blur-preventing agent which are separated from the fibers when the fibers are untangled in addition to the untangled fibers 2. In the following description, the "defibrated material" is at least a part of the defibrated material passing through the defibrating unit 20 and may be one to which other matters are mixed after passing through the defibrating unit 20. One of the defibrated material that is defibrating-processed by the defibrating unit 20, which is supplied to the screening unit 40 described below, is referred to as "defibrated material that is defibrating-processed". The shape of the fiber 2 that is untangled is a string shape or a ribbon shape. However, as illustrated in FIG. 2, the untangled fiber 2 is present in a state (independent stat) of not being entangled in other untangled fibers, but as illustrated in FIG. 3, may be present in a state (state of forming a so-called "lump") of being lump-shaped by being entangled in other untangled fibers 2. A length (length of the untangled fiber 2 in a longitudinal direction, hereinafter, also referred to as "fiber length") of the untangled fiber 2 is, for example, 50 μm or more and 10 μm or less. In addition, the "fiber length" is a distance between both ends when pulling both ends of independent one fiber and then placing the fiber substantially linearly so as not to be cut if necessary. A shape of cross section of the untangled fiber 2 is not particularly limited, may be a polygonal, or may be circular or elliptical. In the following description, the "fiber" mainly indicates the untangled fiber.

Figure 4:
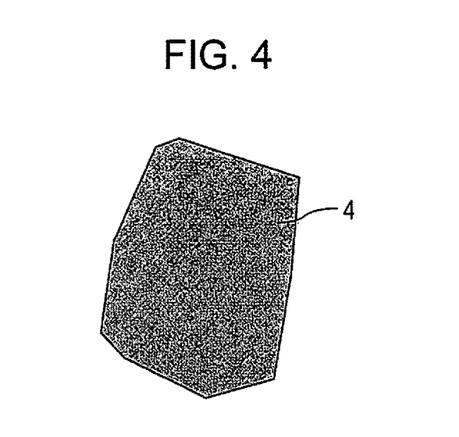
FIG. 4 is a view schematically illustrating an undefibrated piece.

Furthermore, the "defibrated material" may include an "undefibrated piece". As illustrated in FIG. 4, the "undefibrated piece" is debris that is obtained by tearing the small pieces fed into the defibrating unit 20 without defibrating the small pieces in fibrous. That is, an undefibrated piece 4 is the small pieces that are not defibrated even if the small pieces are defibrating-processed in the defibrating unit 20. A shape of the undefibrated piece 4 is not specifically limited, but a size of the undefibrated piece 4 is, for example, 1 mm or more and 10 mm or less when representing in a mesh sieve for measurement test by a sieving method. Moreover, the "defibrating process" means to be fed and discharged the defibration object (small piece) into and from the defibrating unit 20 that is driven and as described above, may include a case where the undefibrated piece 4 that is not defibrated is generated.

The defibrating unit 20 separates the resin particles, the ink particles such as ink, toner, and blur-preventing agent, and the like which are adhered to the small pieces from the fibers. The resin particles and the ink particles are discharged from an outlet 22 together with the defibrated material.

The defibrating unit 20 performs defibrating process on the small pieces fed from the inlet 21 by a rotary blade. The defibrating unit 20 performs defibrating in the dry-type in the air.

A rotational speed of the defibrating unit 20 is 3000 rpm or greater and 10000 rpm or less. If the rotational speed is less than 3000 rpm, a ratio of the undefibrated piece 4 may be increased. If the rotational speed is greater than 10000 rpm, a ratio of the fiber having a relatively short length may be increased and it causes lowering of the strength of the sheet that is manufactured.

It is preferable that the defibrating unit 20 has a mechanism for generating the airflow. In this case, the defibrating unit 20 suctions the small pieces from the inlet 21 by the airflow generated by the defibrating unit 20 together with the airflow, performs defibrating process, and can transport the small pieces to the outlet 22. As illustrated in FIG. 1, the defibrated material discharged from the outlet 22 is fed into the classifying unit 30 via the second transport unit 82. Moreover, when using the defibrating unit 20 that does not have the airflow generating mechanism, a mechanism for generating the airflow that guides the small pieces to the inlet 21 may be provided on an outside.

The classifying unit 30 separates and removes the resin particles and the ink particles from the defibrated material. As the classifying unit 30, an airflow classifier is used. The airflow classifier is provided to generate a whirling airflow, separate the resin particles and the ink particles by the centrifugal force, the size, and the density thereof, and can adjust classification points by adjusting the speed of the airflow and the centrifugal force. Specifically, as the classifying unit 30, cyclone, elbow jet, eddy classifier, and the like are used. Particularly, since the cyclone is simple in structure, it is possible to appropriately use as the classifying unit 30. Hereinafter, a case where as the classifying unit 30, the cyclone is used is described.

The classifying unit 30 has an inlet 31, a cylindrical unit 32 that is connected to the inlet 31, an inverse cone unit 33 that is positioned below the cylindrical unit 32 and is connected to the cylindrical unit 32, a lower outlet 34 that is provided a lower center of the inverse cone unit 33, and an upper outlet 35 that is provided in an upper center of the cylindrical unit 32.

In the classifying unit 30, the airflow carrying the defibrated material introduced from the inlet 31 is changed into a circumferential movement by the cylindrical unit 32 having an outer diameter of substantially 100 mm or greater and 300 mm or less. Thus, the centrifugal force is applied to the introduced defibrated material and the classifying unit 30 separates the defibrated material into a first classified material (fiber 2 and the undefibrated piece 4) and a second classified material (resin particles and the ink particles) of which the size and density are lower than the first classified material. The first classified material is discharged from the lower outlet 34 and is introduced into an inlet 46 of the screening unit 40 via the third transport unit 83. On the other hand, the second classified material is discharged from the upper outlet 35 to the outside of the classifying unit 30 via the fourth transport unit 84. As described above, since the resin particles are discharged to the outside by the classifying unit 30, even if the resin is supplied by the resin supplying unit 50 described below, it is possible to prevent the resin from excessively being supplied with respect to the defibrated material.

Moreover, it is described that the first classified material and the second classified material are separated by the classifying unit 30, it is not translated to be completely separated. The defibrated material having a relatively small size in the second classified material or low density in the first classified material may be discharged to the outside together with the second classified material. The defibrated material having a relatively high density or entangled in the first classified material may be introduced into the screening unit 40 together with the first classified material. In addition, if the raw material is a pulp sheet rather than a waste paper, since the defibrated material corresponding to the second classified material is not included, the sheet manufacturing apparatus may have no classifying unit 30. Thus, materials that are introduced into the screening unit 40 is not only the defibrated material classified by the classifying unit 30. Thus, in the present application, the defibrated material, which passes through the defibrating unit 20 and is introduced into the screening unit 40, is referred to as "defibrated material that is defibrating-processed" and there is a case where the resin particles or the ink particles of small amount enter the defibrated material in addition to the untangled fiber 2 or the undefibrated piece 4.

The screening unit 40 screens the defibrated material that is defibrating-processed into a "passed material" that passes through first openings 42 of the screening unit 40 and a "remaining material" that does not pass through the first openings 42 in the air. Hereinafter, the screening unit 40 will be described in detail.

Figure 5:
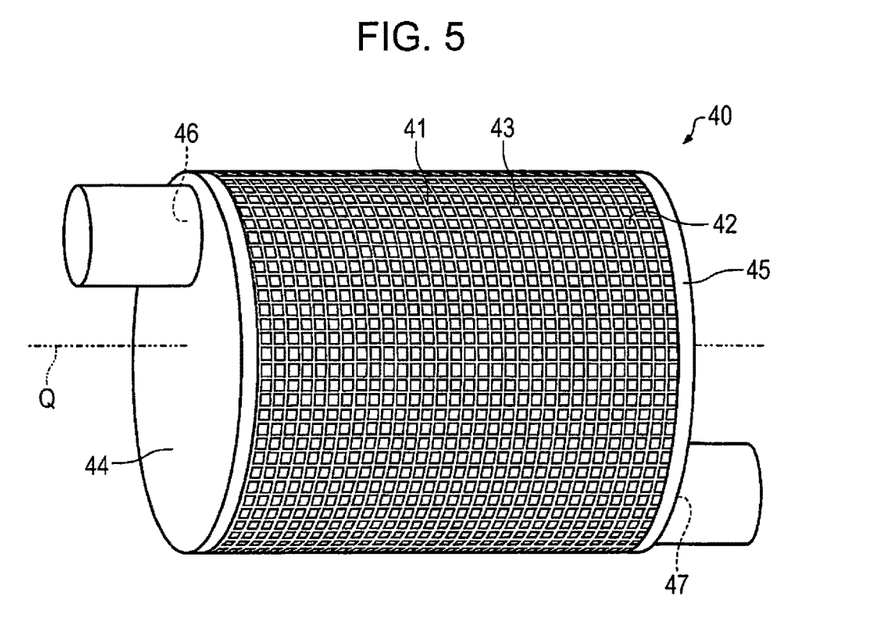
FIG. 5 is a perspective view schematically illustrating a screening unit of the sheet manufacturing apparatus according to the embodiment.
Figure 6:
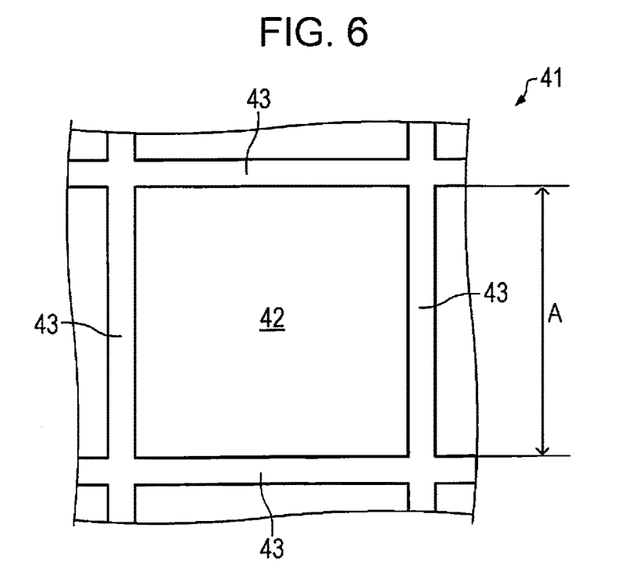
FIG. 6 is a plan view developing a net unit of the screening unit of the sheet manufacturing apparatus according to the embodiment.

As the screening unit 40, a sieve (screen) is used. Here, FIG. 5 is a perspective view schematically illustrating the screening unit 40. FIG. 6 is a plan view (development view) developing a net unit 41 of the screening unit 40. As illustrated in FIG. 5, the screening unit 40 has the net unit 41, disk units 44 and 45, an inlet 46, and an outlet 47. The screening unit 40 is a rotary sieve in which the net unit 41 is rotated around a rotational axis Q by a motor (not illustrated). The net unit 41 is rotated and thereby the defibrated material having a size in the defibrated material within the net unit 41, which is capable of passing through the first openings 42, passes through the first openings 42 and the defibrated material having a size, which is not capable of passing through the first openings 42, does not pass through the first openings 42.

The net unit 41 of the screening unit 40 has a plurality of first openings 42. The net unit 41 is configured of a plain weave wire mesh, a welded wire mesh, or the like. The net unit 41 has the wire mesh to be in a cylindrical shape and an inside of the cylinder is hollow. Moreover, since the cylindrical shape is difficult to be a perfect circle, the cylindrical shape includes an elliptical shape rather than the exact circle and also includes a polygonal shape.

Moreover, as the screening unit 40, expanded metal that is formed by extending a metal plate in which cut lines are run, and a perforated metal in which holes are formed in a metal plate by a press machine may be used instead of the net unit 41 configured of the wire mesh. If the expanded metal is used, the first openings 42 are holes that are formed by extending the cut lines in the metal plate. If the perforated metal is used, the first openings 42 are holes that are formed in the metal plate by the press machine. In addition, a member having the first openings 42 may be made of a material other than metal.

The first openings 42 provided in the net unit 41 of the screening unit 40 are eyes of the net unit 41. As illustrated in FIG. 6, the net unit 41 has a plurality of line portions 43 having a linear shape made of metal and the first opening 42 is a portion surrounded by the line portions 43. A shape of the first opening 42 is not specifically limited as long as the screening unit 40 functions as the sieve and may be a circular shape, an elliptical shape, and the like, but in the example illustrated in FIG. 6, the shape is square. It is preferable that shapes or sizes of a plurality of first openings 42 are equal to each other. It is preferable that the plurality of first openings 42 are uniformly disposed with good uniformity.

Moreover, the "shape of first opening" is a planar shape of the first opening 42 when developing the cylindrical net unit 41 if the net unit 41 is the cylindrical shape. The description about the above-described first opening is similar to a "second opening" described below.

It is preferable that a mesh of the net unit 41 of the screening unit 40 is 300 µm or greater and 2000 µm or less. If the mesh is less than 300 µm, since the length of the fiber is short, cross portions of the fiber and the fiber increase. Since the number of pieces of resin bonding the fiber and the fiber is not limited, portions in which the fibers are not bonded to each other are present and the strength of the manufactured sheet may be lowered. If the mesh is equal to or greater than 2000 µm, a possibility that the undefibrated piece 4 that is not defibrated passes through the first openings 42 increases and texture of the manufactured sheet may be deteriorated.

Moreover, as illustrated in FIG. 6, the "mesh" has a size A between adjacent line portions 43 when developing the net unit 41. If the shape of the first opening 42 is the square, the mesh is a length of one side of the square.

The disk units 44 and 45 of the screening unit 40 are disposed in two openings formed in end portions by making the net unit 41 be the cylindrical shape. The inlet 46 into which the defibrated material that is defibrating-processed is introduced is provided in the disk unit 44 and the outlet 47 from which the remaining material is discharged is provided in the disk unit 45. When the screening unit 40 is rotated, the net unit 41 is rotated and the disk units 44 and 45, the inlet 46, and the outlet 47 are not rotated. The disk units 44 and 45 come into contact with the end portions of the net unit 41 so that the net unit 41 can be rotated. The disk units 44 and 45, and the net unit 41 come into contact with each other without a gap, and thereby the defibrated material within the net unit 41 is prevented from being leaked to the outside. Positions of the inlet 46 and the outlet 47 are not specifically limited, but in the example illustrated in FIG. 5, are positioned in positions shifted from the rotational axis Q of the screening unit 40. Specifically, in the example illustrated in FIG. 5, the inlet 46 is provided vertically above the rotational axis Q and below the uppermost portion of the net unit 41 in a vertical direction. The outlet 47 is provided vertically below the rotational axis Q and above the lowermost portion of the net unit 41 in the vertical direction. The defibrated material that does not pass through the first openings 42 remains on an inside of the net unit 41. It is possible to supply the defibrated material to a space in which the defibrated material does not remain by positioning the inlet 46 above the rotational axis Q in the vertical direction. Thus, the defibrated material does not remain in the position of the inlet 46. In addition, since the defibrated material that does not pass through the first openings 42 remains below the rotational axis Q in the vertical direction, the defibrated material is likely to be discharged by providing the outlet 47 below the rotational axis Q in the vertical direction. In addition, diameters of the inlet 46 and the outlet 47 are smaller than a radius of the cylinder of the net unit 41. Thus, even if the defibrated material supplied from the inlet 46 is excessively increased, the inside of the net unit 41 is not filled with the defibrated material. In addition, the defibrated material is suppressed to be discharged from the outlet 47 without being sufficiently screened.

The net unit 41 of the screening unit 40 is movable. In FIG. 5, the net unit 41 can be rotated around the rotational axis Q. When the net unit 41 is rotated, the first openings 42 also are rotated. A rotational speed of the net unit 41 is, for example, 50 rpm or greater and 800 rpm or less. It is preferable that a moving speed of the net unit 41 of the screening unit 40 is greater than a moving speed of a net unit 61 of the refining unit 60. That is, the net unit 41 of the screening unit 40 is rotated faster than the net unit 61 of the refining unit 60. Here, the "moving speed" can be replaced to the rotational speed of the net units 41 and 61 if the net units 41 and 61 are rotated. That is, the rotational speed of the net unit 41 of the screening unit 40 is faster than the rotational speed of the net unit 61 of the refining unit 60. Moreover, the net unit 41 may be moved in a horizontal direction or the vertical direction in addition to the rotation. Thus, the "movement" includes rotation, linear movement, pendulum-like reciprocation, and the like, the "moving speed" includes the moving speed, a frequency, and a vibration frequency, in respective direction. The description about the "movement" is similar to the "second opening" described below.

In a state where the screening unit 40 is rotated around the rotational axis Q, the defibrated material that is defibrating-processed is introduced from the inlet 46 into the screening unit 40. Then, the net unit 41 is rotated and thereby the defibrated material passing through the first openings 42 is discharged to the outside of the screening unit as the passed material (screened material). The passed material is mainly formed of fibers shorter than the size of the mesh of the first opening 42. Furthermore, the defibrated material that does not pass through the first opening 42 is discharged from the outlet 47 without passing through the first opening 42. The remaining material is the fiber, the undefibrated piece 4, or the lump having a length which does not pass through the first opening 42. As described above, the screening unit 40 can screen the fiber (passed material) having a length shorter than a predetermined length from the defibrated material that is defibrating-processed by the net unit 41 having the first openings 42.

As illustrated in FIG. 1, the remaining material not passing through the first openings 42 of the screening unit 40 is discharged from the outlet 47, is transported to the hopper 5 via the fifth transport unit 85, and is returned to the defibrating unit 20 gain.

The passed material passing through the first openings 42 of the screening unit 40 is transported from the hopper 5 to an inlet 66 of the refining unit 60 via the sixth transport unit 86. A supply port 51 for supplying the resin bonding the fibers to each other (bonding defibrated materials to each other) is provided in the sixth transport unit 86.

The resin supplying unit 50 supplies the resin from the supply port 51 to the sixth transport unit 86 in the air. That is, the resin supplying unit 50 supplies the resin to a path (between the screening unit 40 and the refining unit 60) in which the passed material passing through the first openings 42 is directed from the screening unit 40 to the refining unit 60. The resin supplying unit 50 is not specifically limited as long as the resin is supplied to the sixth transport unit 86 and a screw feeder, a circle feeder, and the like are used.

Moreover, a mechanism for mixing the defibrated material and the resin is not limited to a turbo blower and may be that stirs the defibrated material such as a juicer mixer and the resin by a blade rotating at a high speed or may be one that uses rotation of a container such as a V-shaped mixer.

The resin supplied to the resin supplying unit 50 is resin for bonding a plurality of fibers. The plurality of fibers are not bonded at the time point that the resin is supplied to the sixth transport unit 86. The resin is cured and bonds the plurality of fibers when passing through the sheet forming unit 70 described below.

The resin supplied from the resin supplying unit 50 is thermoplastic resin or thermosetting resin, and may include AS resin, ABS resin, polypropylene, polyethylene, polyvinyl chloride, polystyrene, acrylic resin, polyester resin, polyethylene terephthalate, polyphenylene ether, polybutylene terephthalate, nylon, polyamide, polycarbonate, polyacetal, polyphenylene sulfide, polyether ether ketone, and the like. Those resins may be used singly or may be used by being appropriately mixed.

The resin supplied from the resin supplying unit 50 may be fibrous or may be powder. If the resin is fibrous, it is preferable that a length of the fiber of the resin is equal to or less than the fiber length of the fiber 2. Specifically, the fiber length of the resin is preferably equal to or less than 3 mm and is further preferably equal to or less than 2 mm. If the fiber length of the resin is greater than 3 mm, the resin may not pass through second openings 62 of the refining unit 60 and is unlikely to be uniformly mixed to the fiber 2. If the resin is powder, a particle diameter of the resin is preferably 1 µm or greater and 50 µm or less, and is further preferably 2 µm or greater and 20 µm or less. If the particle diameter of the resin is less than 1 µm, a bonding force bonding the fibers 2 to each other may be lowered. If the particle diameter of the resin is greater than 20 µm, the fiber 2 and the resin are unlikely to be mixed without uniformity, an adhesion force to the fiber 2 is lowered, and then the resin may be separated from the fiber 2.

An amount of the resin supplied from the resin supplying unit 50 is appropriately set in compliance with a type of the sheet that is manufactured. A coloring agent for coloring the fiber 2 or an aggregation preventing agent for preventing aggregation of the fibers 2 may be supplied in compliance with the type to sheet that is manufactured in addition to the resin bonding the fibers 2. The resin that is supplied is mixed to the passed material passing through the first openings 42 by a mixing unit (not illustrated) provided within the sixth transport unit 86. The mixing unit generates the airflow for transporting the passed material and the resin to the refining unit 60 while mixing the passed material and the resin. As illustrated in FIG. 3, the passed materials may be entangled in each other when passing through the sixth transport unit 86.

The refining unit 60 refines the engaged passed material. Furthermore, the refining unit 60 refines the engaged resin if the resin supplied from the resin supplying unit 50 is fibrous. In addition, the refining unit 60 uniformly deposits the passed material or the resin on a deposition unit 72 described below. That is, the term "refining" includes an operation of separating entangled fibers one by one or an operation of uniformly depositing the fibers. Moreover, the fibers are uniformly deposited if the fibers are not entangled.

Figure 7:
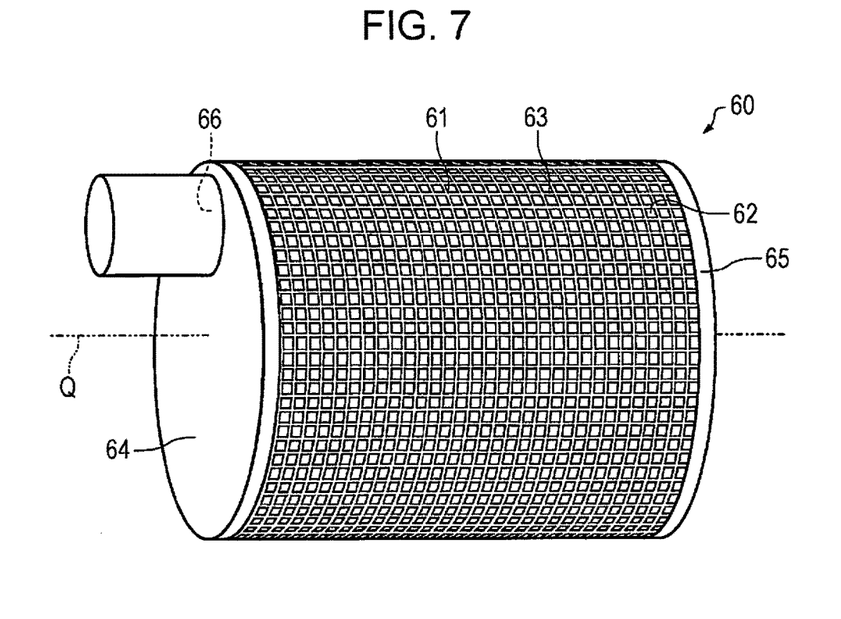
FIG. 7 is a perspective view schematically illustrating a refining unit of the sheet manufacturing apparatus according to the embodiment.

As the refining unit 60, the sieve is used. Here, FIG. 7 is a perspective view schematically illustrating the refining unit 60. As illustrated in FIG. 7, the refining unit 60 is a rotary-type sieve that can be rotated by a motor (not illustrated). Here, the "sieve" used as the refining unit 60 may not have a function of screening a specific object. That is, the "sieve" that is used as the refining unit 60 means a sieve that includes the net unit 61 having a plurality of second openings 62. The refining unit 60 may discharge all the defibrated material and the resin introduced into the refining unit 60 from the second openings 62 to the outside.

The refining unit 60 has the net unit 61, disk units 64 and 65, and the inlet 66. The refining unit 60 is different from the screening unit 40 in that an outlet (portion corresponding to the outlet 47 of the screening unit 40) is not provided. Hereinafter, in the description of the refining unit 60, description of portions having the same shapes as the screening unit 40 will be omitted.

The net unit 61 of the refining unit 60 has the plurality of second openings 62. A size of the second opening 62 is equal to or greater than the size of the first opening 42. That is, the size of the second opening 62 is equal to the size of the first opening 42 or is greater than the size of the first opening 42. However, the upper limit of the size of the second opening 62 is 5 mm. It is possible to cause the entangled fibers to pass through the second opening 62 without causing the lump to pass through the second opening 62 by making the size of the second opening 62 be equal to or less than 5 mm.

Since the passed material passing through the first opening 42 can pass through the second opening 62, the second opening 62 is not clogged. In addition, even if the fibers and the resin entangled within the sixth transport unit 86 are present after passing through the first opening 42, the fibers and the resin are untangled when passing through the second opening 62. Thus, the fibers and the resin passing through the second opening 62 are deposited on the deposition unit 72 described below with a uniform thickness and density. Moreover, if the first opening 42 and the second opening 62 have the same size, the net unit 41 and the net unit 61 can use the same net unit. If the second opening 62 is greater than the first opening 42, it is possible to lower a possibility that the second opening 62 is clogged. In addition, since all or almost all of the passed material introduced into the refining unit 60 passes through the second opening 62, the remaining material remaining in the refining unit 60 without passing through the second opening 62 is little. Thus, the portion corresponding to the outlet 47 of the screening unit 40 is not present in the refining unit 60 and a flow path for returning the defibrated material, which does not pass through the refining unit 60 to the defibrating unit 20, is not present. That is, a flow path communicating between the refining unit 60 and the defibrating unit 20 is not provided.

Moreover, the "size of the opening" is an area of the opening in a state where the net units 41 and 61 are developed, as illustrated in FIGS. 5 and 7, if the net units 41 and 61 are the cylindrical shape. Specifically, if the net unit 41 is made of the wire mesh (further specifically, the shape of the openings 42 and 62 is square), the "size of the opening" is may be the mesh of the net units 41 and 61. Furthermore, if the shape of the openings 42 and 62 is a circular shape, the "size of the opening" is may be a diameter of the openings 42 and 62. If the shape is one other than the square or the circular shape, the size may be a dimension of a portion that has the greatest dimension. Moreover, "equal to or greater than the size of the opening" refers that the size of the opening is equal to or greater than the size thereof.

The net unit 61 of the refining unit 60 is movable. Specifically, as illustrated in FIG. 7, the net unit 61 is a cylindrical shape and is rotated around the rotational axis Q. When the net unit 61 is rotated, the second openings 62 are also rotated. A rotational speed of the net unit 61 is, for example, 30 rpm or greater and 600 rpm or less. That is, the rotational speed of the net unit 41 is faster than the rotational speed of the net unit 61. Since the defibrated material having a size greater than that of the mesh are also included in the net unit 41, the defibrated material having a size smaller than the size of the mesh may be inhibited to pass through the mesh. Thus, the defibrated material is likely to pass through the first openings 42 as the rotational speed of the net unit 41 is increased. On the other hand, since the size of the opening of the net unit 61 is equal to or greater than the size of the opening of the net unit 41, the defibrated material is likely to pass through the second openings 62 even if the rotational speed thereof is slower than the net unit 41.

In a state where the refining unit 60 is rotated around the rotational axis Q, a mixture of the passed material (fiber) and the resin passing through the screening unit 40 is introduced from the inlet 66 into the refining unit 60. The mixture introduced into the refining unit 60 is moved on the net unit 61 side by the centrifugal force. As described above, the mixture introduced into the refining unit 60 may include the engaged resin or the resin and the entangled fibers or the resin is refined by the net unit 61 that is rotated in the air. Then, untangled fiber or the resin passes through the second openings 62. The fiber and the resin passing through the second openings 62 pass through the air and are uniformly deposited in the deposition unit 72 described below.

Moreover, "entangled fibers being untangled" includes a case where the entangled fibers are completely untangled (case of a state where all fibers are untangled) and a case where a part of the entangled fibers is untangled to an extent that the entangled fibers pass through the second openings 62. The means that "the engaged resin being untangled" are similar to the above description. Moreover, if the defibrated material has a size equal to the mesh of the second opening 62, even if the defibrated material passing through the second opening 62 is entangled, there is no problem in the texture of the defibrated material. In addition, "uniformly deposited" refers that the deposited defibrated materials are deposited in the same thickness and the same density. However, since all the deposited materials are not manufactured as the sheet, a portion to be the sheet may be uniform. Terms "not uniformly deposited" refers that the deposited material is not uniformly deposited.

The defibrated material and the resin passing through the second openings 62 of the refining unit 60 are deposited in the deposition unit 72 of the sheet forming unit 70. As illustrated in FIG. 1, the sheet forming unit 70 has the deposition unit 72, tension rollers 74, a heater roller 76, tension rollers 77, and a winding roller 78. The sheet forming unit 70 forms the sheet by using the defibrated material and the resin passing through the refining unit 60. Hereinafter, the sheet forming unit 70 will be described in detail.

The deposition unit 72 of the sheet forming unit 70 deposits the defibrated material and the resin by receiving the defibrated material and the resin passing through the second openings 62 of the refining unit 60. The deposition unit 72 is positioned below the refining unit 60. The deposition unit 72 is provided to receive the defibrated material and the resin passing through the second openings 62 and, for example, is a mesh belt. A mesh that is tensioned by the tension rollers 74 is formed in the mesh belt. The deposition unit 72 is moved by rotating the tension rollers 74. The defibrated material and the resin are continuously fall from the refining unit 60 and a web having a uniform thickness is formed on the deposition unit 72 while the deposition unit 72 is continuously moved.

Moreover, even not illustrated, a suction device, which is positioned below the refining unit 60 via the deposition unit 72 and generates the airflow (airflow from the refining unit 60 to the deposition unit 72) downward, may be provided. Thus, it is possible to suction the defibrated material and the resin dispersed in the air and to increase a discharge speed from the refining unit 60. As a result, it is possible to increase productivity of the sheet manufacturing apparatus 100. In addition, it is possible to form a downflow in a falling path of the defibrated material and the resin and to prevent the defibrated material or the resin from being entangled during falling by the suction device.

A material of the mesh belt used as the deposition unit 72 of the sheet forming unit 70 is metal, resin, nonwoven, and the like. A hole diameter (diameter) of the mesh belt is, for example, 60 µm or greater and 250 µm or less. If the hole diameter of the mesh belt is less than 60 µm, it may be difficult to form stable airflow by the suction device described above. If the hole diameter of the mesh belt is greater than 250 µm, since the fibers enter between the meshes, unevenness of a surface of the sheet that is manufactured may increase.

The defibrated material and the resin deposited on the deposition unit 72 of the sheet forming unit 70 are heated and pressed by passing through the heater roller 76 along with the movement of the deposition unit 72. The resin functions as a bonding agent and bonds the fibers to each other by heating, the fibers are thinned by pressing, the surface thereof is smoothed by passing through a calendar roller (not illustrated), and then a sheet P is formed. In the illustrated example, the sheet P is wound around the winding roller 78.

As described above, it is possible to manufacture the sheet P.

The sheet manufacturing apparatus 100 has the following effects.

The defibrated material passes through the first openings 42 of the screening unit 40 and then the defibrated material that does not pass through the first openings 42 is screened. Then, the defibrated material having the size passing through the first openings 42 is aligned. However, since the first openings 42 may be portions through which the defibrated material does not pass due to clogging, the passed defibrated material is deposited with non-uniform density. Thus, the defibrated material passes through the second openings 62 of the refining unit 60. Since the size of the opening of the second opening 62 is equal to or greater than the size of the opening of the first opening 42, the defibrated material passing through the first opening 42 is not clogged in the second opening 62. Thus, the defibrated material passing through the second openings 62 can be deposited on the deposition unit 72 with uniform thickness and density. In addition, the defibrated material that is gathered in the process of transporting from the screening unit 40 to the refining unit 60 can also be untangled by passing through the second openings 62. As a result, the sheet manufacturing apparatus 100 can manufacture the sheet with high strength and good texture. Moreover, the effects of the present application are particularly good in a paper described below. In the paper manufacturing apparatus of the related art, since it is not possible to deposit the defibrated material with uniform thickness and density, it is not possible to manufacture a forming material with thin thickness and high strength required to the paper. In the present application, in a case of the paper, it is possible to manufacture the paper with thin thickness, high strength, and good texture, and to solve the problem in the dry-type paper manufacturing apparatus. The effects exert in the paper, but also in nonwoven fabric, an external shape is good without being immediately pulled out.

Here, in PTL 1, only one of the screening unit 40 and the refining unit 60 of the present application is present. If only one is present, the defibrated material is in a state of passing through the screening unit 40 of the present application and the defibrated material is deposited non-uniformly due to the clogging. Thus, it is possible to manufacture the sheet favorably in the present application. Moreover, in PTL 1, two forming drums are provided, but the defibrated material that passes through one opening is not transported to the other side and respectively do not have functions of the screening unit and the refining unit.

Furthermore, two screening units 40 are used and the opening of the screening unit on a downstream side is smaller than the opening of an upstream side in the transport direction of the defibrated material. In this case, clogging of the opening also occurs in the screening unit on the downstream side and the defibrated material is deposited non-uniformly. Thus, there is no effect even though two screening units are provided and the refining unit having the effect to untangle the defibrated material or the effect to deposit uniformly the defibrated material is required on the downstream side.

Moreover, "texture" is a quality of the sheet and, specifically, as illustrated in the following Experimental Examples, the texture refers a degree (extent) of a difference in density that is viewed when irradiating the sheet with light from a back surface of the sheet. That is, the "sheet having good texture" refers a sheet having small difference in the density.

Here, it is also conceivable to reduce the ratio of, the undefibrated piece 4 by increasing the rotational speed of the defibrating unit. However, if the rotational speed of the defibrating unit is increased, energy (defibrating energy) consumed in the defibrating unit is increased and it is not preferable in the viewpoint of energy saving. In addition, if the rotational speed of the defibrating unit is increased, the ratio of the short fiber is increased, bonding strength of the defibrated material is weakened, and thereby the strength of the sheet may be lowered. In the sheet manufacturing apparatus 100, it is possible to prevent the strength of the sheet from lowering due to the short fiber while suppressing defibrating energy.

Moreover, the "strength of the sheet" refers a tensile structure of the sheet and specifically, as illustrated in the following Experimental Examples, is strength that is evaluated by using a tensile strength tester.

In the sheet manufacturing apparatus 100, since the size of the second opening 62 is greater than the size of the first opening 42, it is possible to reduce a possibility of remaining of the defibrated material within the refining unit 60. Thus, it is possible to prevent the refining unit 60 from being clogged and to deposit the defibrated material with uniform thickness and density.

In the sheet manufacturing apparatus 100, the sizes of the plurality of first openings 42 are equal to each other and the sizes of the plurality of second openings 62 are equal to each other. If the sizes of the plurality of first openings 42 are equal to each other, since the passed material passing through the first openings 42 is screened under the same conditions, variation of the size of the passed material is reduced. It is preferable that the shapes of the plurality of first openings 42 are equal to each other, but the plurality of first openings 42 may have the same size even if the shapes are different from each other. It is possible to uniformly deposit the fiber or the resin passing through the second openings 62 on the deposition unit 72 by making the sizes of the plurality of second openings 62 be equal to each other. Moreover, if the plurality of second openings 62 are arranged at equal intervals, it is possible to uniformly deposit the fiber and the resin.

In the sheet manufacturing apparatus 100, the moving speed of the screening unit 40 is greater than the moving speed of the refining unit 60. It is preferable that a processing performance of the screening unit 40 is improved by increasing the moving speed of the screening unit 40 so that a discharging amount per unit time of the defibrated material that is discharged by passing through the first openings 42 of the screening unit 40 is equal (approximate) to a discharging amount per unit time of the defibrated material that is discharged by passing through the second openings 62 of the refining unit 60. Particularly, if the size of the second opening 62 is greater than the size of the first opening 42, it is further preferable that the moving speed of the screening unit 40 is greater than the moving speed of the refining unit 60. Moreover, the screening unit 40 can easily screen the defibrated material by being moved. On the other hand, since the refining unit 60 is intended to untangle the fibers or uniformly deposit the fibers by causing the fibers to pass therethrough, the refining unit 60 may not be moved. In this case, for example, the fibers pass through the second openings 62 by using, for example, the airflow.

The sheet manufacturing apparatus 100 includes the resin supplying unit 50 supplying the resin to the sixth transport unit 86 connecting the screening unit 40 and the refining unit 60. Thus, even if the defibrated material and the resin are entangled within the sixth transport unit 86, it is possible to untangle the defibrated material and the resin that are entangled by the refining unit 60 and to deposit the defibrated material and the resin on the deposition unit 72 with good uniformity. In addition, if the resin is supplied to the third transport unit 83 on the upstream side of the screening unit 40, the resin adhered to the defibrated material not passing through the first openings 42 in the screening unit 40 is not used in the manufacturing of the sheet. Thus, the resin is waste, the amount of the resin used in the manufacturing of the sheet is reduced, and the strength of the sheet is insufficient.

The sheet manufacturing apparatus 100 includes the defibrating unit 20 that performs defibrating process on the defibrated material and the fifth transport unit (returning flow path) 85 for returning the remaining material not passing through the screening unit 40 to the defibrating unit 20. Thus, the defibrated material not passing through the first openings 42 in the screening unit 40 can be defibrating-processed in the defibrating unit 20. That is, the remaining material can be used for the manufacturing of the sheet without being discarded.

Moreover, the sheet manufacturing apparatus 100 may not have the flow path 85 for returning the defibrated material that does not pass through the refining unit 60 to the defibrating unit 20. In such a sheet manufacturing apparatus 100, since the defibrated material that does not pass through the refining unit 60 is little, it is possible to omit the flow path for returning the defibrated material to the defibrating unit 20 and to reduce the sheet manufacturing apparatus 100 in size.

2. Experimental Examples

Hereinafter, Experimental Examples are illustrated and the invention is described in detail. Moreover, the invention is not limited to any of the following Experimental Examples.

2. Creating Samples

2. Example 1

As the raw material, a paper for a Plain Paper Copier (PPC) of an A4 size was used. As the sheet manufacturing apparatus, as illustrated in FIG. 1, the sheet manufacturing apparatus 100 was used.

The PPC sheet was cut into paper pieces of 6 mm×14 mm in the crushing unit (shedder) 10 before feeding the PPC sheet into the defibrating unit 20. As the defibrating unit 20, an Impeller Mill 250 (manufactured by Seishin Co., Ltd.) was used. A rotational speed of the Impeller Mill 250 was 5000 rpm and the defibrated material was generated by defibrating the cut paper pieces. The defibrated material was transported to the screening unit 40 via the classifying unit (cyclone) 30.

As the screening unit 40, a rotary-type sieve was used. As the net unit 41 of the screening unit 40, the mesh is 970 µm, a diameter of the line was 300 µm, an outer diameter was 220 mm, and the rotational speed was 220 rpm.

The fibers were added to the material passing through the first openings 42 of the screening unit 40. Specifically, powder resin (polyester) having an average particle diameter D50=8.2 µm was added by 15 parts by weight with respect to the material of 100 parts by weight passing through the first openings 42. Mixing of the material and the resin passing through the first openings 42 was performed by a turbo fan blower provided within the sixth transport unit 86.

As the refining unit 60, the rotary-type sieve having the same shape and the size as those of the sieve used as the screening unit 40 except that the outlet 47 is not provided was used. That is, as the net unit 61 of the refining unit 60, the mesh was 970 µm, the line diameter was 300 µm, and the outer diameter was 220 mm. The rotational speed was 150 rpm.

The defibrated material and the resin deposited on the deposition unit 72, which pass through the refining unit 60, became a thin-layered sheet (paper) by being heated and pressed by the heater roller 76. A temperature of the paper after passing through the heater roller 76 was 140° C. and a pressure applied by the heater roller 76 was approximately 30 kgf/cm². A thickness of the formed paper was approximately 90 µm.

2.1.2. Example 2

As a raw material, a paper was manufactured in the same steps as in Example 1 (in the same sheet manufacturing apparatus) except that the paper manufactured in Example 1 was used.

2.1.3 Comparison Example 1

A paper was manufactured by using a sheet manufacturing apparatus that does not have the screening unit 40. Other portions (except that the screening unit 40 is not provided) are the same as the sheet manufacturing apparatus used in Example 1.

2. Comparison Example 2

A paper was manufactured in the same steps as in Comparison Example 1 (in the same sheet manufacturing apparatus) except that the rotational speed of the defibrating unit 20 was 12000 rpm.

2.2 Evaluation Result

Texture and the tensile strength of the paper of Examples 1 and 2, and Comparison Examples 1 and 2 were evaluated. The texture was evaluated by a difference in the density by observing viewed when irradiating the paper with light from the back surface of the paper. The tensile strength was measured by using the tensile strength tester such that a test piece (paper piece) having a length of 150 mm and a width of 15 mm becomes a span length of 100 mm. Evaluation results of the texture and the tensile strength are illustrated in Table 1. Furthermore, energy (defibrating energy) consumed in defibrating process in the defibrating unit 20 is illustrated in Table 1.

TABLE 1

| | Tensile Strength (MPa) | Clogging of Refining Unit | Texture | Defibrating Energy [kWh/m$^2$] |
|---|---|---|---|---|
| Example 1 | 45 | No | Good | 0.026 |
| Example 2 | 51 | No | Good | 0.023 |
| Comparison Example 1 | 45 | Yes | Initial: Good After Clogging: Density Unevenness | 0.026 |
| Comparison Example 2 | 11 | Yes | Initial: Good After Clogging: Density Unevenness | 0.046 |

As illustrated in Table 1, in the texture evaluation, the papers of Examples 1 and 2 were found to have good texture. In addition, the tensile strength of the papers of Examples 1 and 2 was equal to or greater than 45 MPa and the papers were found to have high strength. In addition, In Examples 1 and 2, clogging of the net unit 61 of the refining unit 60 did not occur. From the results of Example 2, the paper that is created by the paper as the raw material created by the sheet manufacturing apparatus also meets the performance as the paper. Thus, it is possible to repeatedly use the paper that is created by the apparatus without using a commercially available paper.

In Comparison Example 1, the undefibrated piece that is not defibrated in the defibrating unit or the defibrated material that is entangled gradually remained within the refining unit, and the clogging occurred during continuously operating the apparatus. As a result, the paper could not continuously manufacture for a long period of time. It was found that paper manufactured in operation easily had the texture substantially the same as that of Example 1, but the texture of a paper that was manufactured after the clogging occurred was deteriorated.

Also in Comparison Example 2, the clogging occurred in the refining unit during continuously operating the apparatus. However, a degree of the clogging was lighter than Comparison Example 1. Similar to Comparison Example 1, it was found that the paper manufactured after the clogging occurred was deteriorated. However, a degree of density unevenness was better than that of Comparison Example 1.

The tensile strength of Comparison Example 2 was as low as 11 MPa. It is conceivable that this is because the rotational speed of the defibrated material is high and a ratio of the defibrated material having the fibers of short lengths is increased in Comparison Example 2. Here, Table 2 illustrates a distribution of the fiber length of the defibrated material after passing through the defibrating unit and before being introduced into the refining unit. Specifically, Table 2 illustrates the distribution of the fiber lengths of 20000 defibrated materials having the fiber length equal to or greater than 50 μm measured by a Fiber Tester (L&W Co). It was found that the fiber length of the defibrated material in Comparison Example 2 is shorter than that of Example 1 by Table 2.

TABLE 2

| | Less than 200 μm | 200 μm or greater and 800 μm or less | Greater than 800 μm |
|---|---|---|---|
| Example 1 | 23.5% | 65.9% | 10.6% |
| Comparison Example 2 | 38.2% | 55.1% | 6.7% |

The invention includes the substantially same configuration (same configuration in the function, the method, and the result or the same configuration in the object and the effect) as the configuration described in the embodiment. In addition, the invention includes configurations that replace non-essential portions of the configuration described in the embodiment. In addition, the invention includes configurations that can achieve the same operational effect or the same object as the configuration described in the embodiment. In addition, the invention includes configurations that are obtained by adding known technique to the configuration described in the embodiment.

Moreover, the sheet manufactured by the sheet manufacturing apparatus 100 mainly refers to those in a sheet shape. However, the sheet is not limited to the sheet shape and may be a board shape or a web shape. In the present specification, the sheet is divided into paper and non-woven fabric. Paper includes aspects formed in a thin sheet shape and includes recording paper for writing or printing, wallpaper, wrapping paper, colored paper, drawing paper, Kent paper, and the like. Since non-woven fabric has a thickness thicker than that of paper or has strength lower than that of paper, the non-woven fabric includes general non-woven fabric, fiber board, tissue paper, kitchen paper, cleaner, filter, liquid absorption material, sound-absorbing material, cushioning material, mat, and the like. Furthermore, as the raw material, plant fibers such as cellulose, chemical fibers such as polyethylene terephthalate (PET) and polyester, and animal fibers such as wool and silk may be included.

The net unit 41 of the screening unit 40 or the net unit 61 of the refining unit 60 is the cylindrical shape, but may be a planar shape. A plurality of openings may be opened in a plate or planar meshes may be provided.

In addition, although not illustrated, a water sprayer to add spraying water to the deposited material deposited on the deposition unit 72 may be provided. Thus, it is possible to increase strength of hydrogen bonds when forming the sheet P. Spray for adding water is performed with respect to the deposited material before passing through the heater roller 76. Starch, polyvinyl alcohol (PVA), and the like may be added to the water sprayed by the water sprayer. Thus, it is possible to further increase the strength of the sheet P.

In addition, in the examples described above, the description is given for an aspect that the sheet P is wound around the winding roller 78, but the sheet P is cut into a desired size by a cutting machine (not illustrated) or may be stacked on a stacker and the like.

Figure 8:
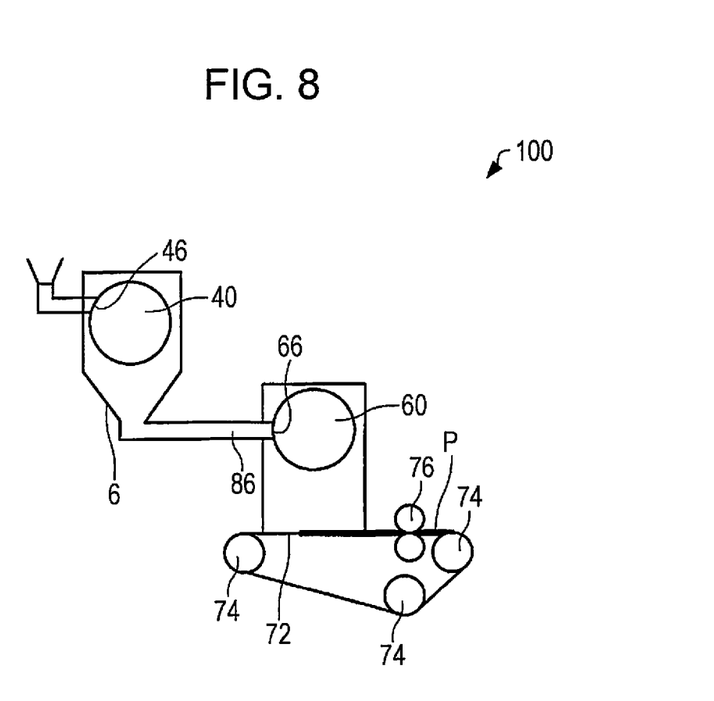
FIG. 8 is a view schematically illustrating the sheet manufacturing apparatus according to the embodiment.

In the sheet manufacturing apparatus 100, as illustrated in FIG. 8, the crushing unit 10 may be omitted. For example, if the defibrated material that is crushed by a known shredder is used as the raw material, the crushing unit 10 is not necessary.

In the sheet manufacturing apparatus 100, as illustrated in FIG. 8, the crushing unit 10 and the defibrating unit 20 may be omitted. If the defibrated material that is defibrating-processed by a defibrating machine separated from the sheet manufacturing apparatus 100 is used as the raw material, the crushing unit 10 and the defibrating unit 20 are not necessary. Thus, the "defibrated material that is defibrating-processed" also includes a defibrated material that is processed in the defibrating unit that is not mounted on the sheet manufacturing apparatus 100.

The fifth transport unit 85 as the returning flow path may be omitted. The remaining material may be recovered and discarded without returning to the defibrating unit 20. In addition, if the defibrating unit 20 having performance by which the remaining material does not appear, the fifth transport unit 85 may be omitted.

In the present application, "uniform", "same", "equal intervals", and the like are used as means that the density, the distance, the dimensions, and the like are equal. These are desirably equal but since completely equal is difficult, one that a value that is obtained by accumulation of errors, variations, and the like is also included.

Here, the waste paper is used as the material, the invention is a waste paper recycling apparatus including a defibrating unit that performs a defibrating process on a waste paper, a screening unit that has first openings screening a defibrated material that is defibrating-processed in the defibrating unit, a refining unit that has second openings having sizes equal to or greater than sizes of the first openings and refines the defibrated material passing through the screening unit by causing the defibrated material to pass through the second openings, and a deposition unit on which the defibrated material passing through the refining unit is deposited. Moreover, the waste paper mainly indicates printed paper, but may include paper, on which print is not performed, passing through a printing apparatus.

REFERENCE SIGNS LIST

2 FIBER
4 UNDEFIBRATED PIECE
5, 6 HOPPER
10 CRUSHING UNIT
11 CRUSHING BLADE
20 DEFIBRATING UNIT
21 INLET
22 OUTLET
30 CLASSIFYING UNIT
31 INLET
32 CYLINDRICAL UNIT
33 INVERSE CONE UNIT
34 LOWER OUTLET
35 UPPER OUTLET
40 SCREENING UNIT
41 NET UNIT
42 FIRST OPENING
43 LINE PORTION
44, 45 DISK UNIT
46 INLET
47 OUTLET
50 RESIN SUPPLYING UNIT
51 SUPPLY PORT
60 REFINING UNIT
61 NET UNIT
62 SECOND OPENING
64, 65 DISK UNITS
66 INLET
70 SHEET FORMING UNIT
72 DEPOSITION UNIT
74 TENSION ROLLER
76 HEATER ROLLER
77 TENSION ROLLER
78 WINDING ROLLER
81 FIRST TRANSPORT UNIT
82 SECOND TRANSPORT UNIT
83 THIRD TRANSPORT UNIT
84 FOURTH TRANSPORT UNIT
85 FIFTH TRANSPORT UNIT
86 SIXTH TRANSPORT UNIT
100 SHEET MANUFACTURING APPARATUS

The invention claimed is:

1. A sheet manufacturing apparatus comprising:
a screening unit that has first openings for screening a defibrated material that is defibrating-processed;
a refining unit that has second openings having sizes equal to or greater than sizes of the first openings and refines the defibrated material passing through the screening unit by causing the defibrated material to pass through the second openings; and
a deposition unit on which the defibrated material passing through the refining unit is deposited.

2. The sheet manufacturing apparatus according to claim 1, wherein the sizes of the second openings are greater than the sizes of the first openings.

3. The sheet manufacturing apparatus according to claim 1,
wherein the refining unit is provided with a plurality of the second openings, and
wherein the sizes of the plurality of second openings are equal to each other.

4. The sheet manufacturing apparatus according to claim 1,
wherein the screening unit is provided with a plurality of the first openings, and
wherein the sizes of the plurality of first openings are equal to each other.

5. The sheet manufacturing apparatus according to claim 1,
wherein the screening unit is movable,
wherein the refining unit is movable, and
wherein the screening unit moves faster than the refining unit.

6. The sheet manufacturing apparatus according to claim 1,
wherein the screening unit is movable, and
wherein the screening unit moves faster than the refining unit.

7. The sheet manufacturing apparatus according to claim 1, further comprising:
a supplying unit that supplies resin bonding the defibrated material between the screening unit and the refining unit.

8. The sheet manufacturing apparatus according to claim 1, further comprising:
a defibrating unit that performs a defibrating process on a defibration object; and
a returning flow path that returns the defibrated material not passing through the screening unit to the defibrating unit.

9. A sheet manufacturing apparatus comprising:
a screening unit that screens a defibrated material that is defibrating-processed by causing the defibrated material to pass through first openings;
a refining unit that refines the defibrated material passing through the screening unit; and
a deposition unit on which the defibrated material passing through the refining unit is deposited.

10. A sheet manufacturing method comprising:
a step of screening a defibrated material that is defibrating-processed by first openings;
a step of causing the defibrated material passing through the first openings to pass through second openings having sizes equal to or greater than sizes of the first openings; and
a step of depositing the defibrated material passing through the second openings.

11. The sheet manufacturing method according to claim 10,
wherein a plurality of the first openings and the second openings are respectively provided,
wherein the sizes of the plurality of first openings are equal to each other, and
wherein the sizes of the plurality of second openings are equal to each other.

12. The sheet manufacturing method according to claim 10,
wherein a screening unit having the first openings and a refining unit having the second openings are movable, and
wherein the screening unit moves faster than the refining unit.

13. The sheet manufacturing method according to claim 10, further comprising:
a step of supplying resin that bonds the defibrated material between the step of screening the defibrated material that is defibrating-processed by the first openings and the step of causing the defibrated material passing through the first openings to pass through the second openings.

14. The sheet manufacturing method according to claim 10, further comprising:
a step of returning the defibrated material not passing through the first openings to a defibrating unit in which a defibration object is defibrating-processed.

* * * * *